(12) United States Patent
Ito et al.

(10) Patent No.: US 7,301,255 B2
(45) Date of Patent: Nov. 27, 2007

(54) SURFACE ACOUSTIC WAVE APPARATUS AND COMMUNICATIONS DEVICE

(75) Inventors: Motoki Ito, Soraku-gun (JP); Daisuke Makibuchi, Soraku-gun (JP); Yoshifumi Yamagata, Kokubu (JP); Kouichi Maruta, Kokubu (JP); Yuuko Yokota, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 9 days.

(21) Appl. No.: 10/810,728

(22) Filed: Mar. 26, 2004

(65) Prior Publication Data

US 2004/0189147 A1  Sep. 30, 2004

(30) Foreign Application Priority Data

Mar. 27, 2003  (JP)  ............... 2003-089362

(51) Int. Cl.
*H03H 9/25* (2006.01)
(52) U.S. Cl. .................. 310/313 R; 333/193
(58) Field of Classification Search ..... 310/313 A–313 D, 313 R; 333/190–193
See application file for complete search history.

(56) References Cited

U.S. PATENT DOCUMENTS

| | | | | |
|---|---|---|---|---|
| 4,381,469 A | * | 4/1983 | Ogawa et al. | .......... 310/313 R |
| 4,448,805 A | | 5/1984 | Lewis | |
| 4,628,222 A | | 12/1986 | Lewis | |
| 4,967,113 A | * | 10/1990 | Mitsutsuka | .............. 310/313 R |
| 5,028,101 A | * | 7/1991 | Sugai et al. | ................. 333/193 |
| 5,243,250 A | * | 9/1993 | Mitsutsuka | .............. 310/313 R |
| 5,307,035 A | * | 4/1994 | Dufilie et al. | ................ 333/193 |
| 5,438,305 A | * | 8/1995 | Hikita et al. | ................... 333/32 |
| 5,889,446 A | | 3/1999 | Yamada et al. | |
| 6,580,197 B2 | * | 6/2003 | Flowers | ................... 310/313 R |
| 2002/0043891 A1 | | 4/2002 | Takahashi et al. | |
| 2005/0270124 A1 | * | 12/2005 | Ebata et al. | ................. 333/193 |

FOREIGN PATENT DOCUMENTS

| | | |
|---|---|---|
| GB | 2088 167 | 10/1981 |
| JP | 04-293310 | 10/1992 |
| JP | 5-59609 | 8/1993 |
| JP | 06-125038 | * 6/1994 |
| JP | 08-321739 | 12/1996 |
| JP | 09-260994 | 10/1997 |
| JP | 10-107582 | 4/1998 |
| JP | 10-163802 | 6/1998 |
| JP | 2000-183680 | 6/2000 |
| JP | 2001-345667 | 12/2001 |

* cited by examiner

*Primary Examiner*—Thomas M. Dougherty
(74) *Attorney, Agent, or Firm*—Hogan & Hartson LLP

(57) ABSTRACT

In a surface acoustic wave element 10, in which IDT electrodes 31 and 32, a grounding electrode 37, etc. are formed one main surface of a piezoelectric substrate 20, resistors 40 made of a semiconductor are provided to connection electrodes 38 that interconnect the respective electrodes. By forcing the charges generated in the IDT electrodes to move via the resistors 40, it is possible to provide a compact, highly reliable surface acoustic wave apparatus capable of preventing an electrostatic discharge damage in the IDT electrodes.

21 Claims, 10 Drawing Sheets a : 30μm
b : 10μm
c : 5μm

SURFACE ACOUSTIC WAVE APPARATUS AND COMMUNICATIONS DEVICE

This application is based on application No. 2003-089362 filed in Japan, the content of which is incorporated hereinto by reference.

BACKGROUND OF THE INVENTION

1. Field of the Invention

The present invention relates to a surface acoustic wave apparatus used in a mobile communications device, such as a mobile phone, a device mounted to a vehicle, a device for medical use, etc., and a communications device using the same, and more particularly to a surface acoustic wave apparatus and a communications device characterized by its structure such that prevents a discharge breakdown in an IDT (Inter Digital Transducer) electrode.

2. Description of the Related Art

A surface acoustic wave apparatus, such as a surface acoustic wave resonator and a surface acoustic wave filter, has been widely used in wireless communications devices of various kinds using a microwave band, devices mounted to a vehicle, devices for medical use, etc.

A conventional surface acoustic wave apparatus has a problem that a discharge breakdown occurs in an IDT electrode when exposed to an abrupt change in temperature due to the pyroelectric property of the piezoelectric substrate, which results in deterioration of the electric characteristic.

Hence, in order to prevent a discharge breakdown in the IDT electrode, improvements have been added to date.

For example, a structure in which paired comb-teeth-shaped electrodes forming the IDT electrode are connected to each other via a thin-film resistor has been known as the conventional surface acoustic wave apparatus for which the discharge breakdown preventive measure is taken.

Ta—$SiO_2$ or Nb—$SiO_2$ is used as a material of the thin-film resistor that electrostatically short-circuits the paired comb-teeth-shaped electrodes forming the IDT electrode.

Charges induced on the IDT electrode are forced to flow through the thin-film resistor, so that the thin-film resistor can prevent the occurrence of a discharge breakdown between the opposing comb-teeth-shaped electrodes.

The conventional surface acoustic wave apparatus described above, however, has the problems as follows.

When the resistor is connected, the electric characteristic of the surface acoustic wave apparatus readily deteriorates. In order to prevent such deterioration, it is necessary to keep a current flowing through the resistor during a normal operation small. It is therefore preferable that the resistor has a reasonably large resistance value.

The resistivity of the aforementioned material of Ta—$SiO_2$ or Nb—$SiO_2$ is as small as 200 mΩ·cm or less. Hence, in order to achieve a large resistance value, a sufficient length is necessary. For example, in order to achieve a resistance value of 1 MΩ, given 0.5 μm and 100 μm as the thickness and the width of the resistor, respectively, then a length as long as 25 mm is necessary.

The surface acoustic wave element employed in today's surface acoustic wave filter or the like used in a GHz band is of a size of approximately 1 mm×1 mm in length and width. Thus, an approximately 25-fold area is necessary in order to form the aforementioned resistor, which markedly increases the surface acoustic wave element in size.

By lessening the thickness and the width to the least possible level in order to reduce the resistor in size, for example, by lessening the thickness and the width to 0.5 μm and 1 μm, respectively, the length is shortened to 250 μm. It is thus possible to achieve a reduction in size. However, such an elongate resistor readily breaks due to a rise in temperature when a current flows and the resistor generates heats. When the resistor is heated to approximately 300° C. at the time of reflow soldering and a large current flows through the resistor as charges are induced by the pyroelectric effect, the resistor generates heats and the temperature rises further, which increases the possibility of a break in the resistor per se. Once the resistor breaks, there is no means for releasing the charges induced by the pyroelectric effect. It is thus no longer possible to prevent the occurrence of a discharge breakdown in the IDT electrode caused by a change in temperature.

Also, the material per se of the thin-film resistor has a problem in its heat resistance, and oxidation proceeds rapidly when the temperature rises, which raises a concern with respect to the reliability.

The invention therefore has an advantage to provide a compact, highly reliable surface acoustic wave apparatus.

BRIEF SUMMARY OF THE INVENTION

A surface acoustic wave apparatus of the invention is provided with a surface acoustic wave element to be mounted, which includes a piezoelectric substrate, an electrode, formed on one main surface of the piezoelectric substrate, to be at a ground potential, and an IDT electrode formed on the same main surface of the piezoelectric substrate.

According to the invention, either of the comb-teeth-shaped electrodes forming the IDT electrode is connected to the electrode to be at the ground potential via a resistor formed on the piezoelectric substrate, and the resistor is made of a semiconductor.

Because the paired comb-teeth-shaped electrodes forming the IDT electrode are electrically connected to each other via the resistor, charges induced by the pyroelectric effect due to an abrupt change in temperature or the like move through the resistor, which prevents the generation of a potential difference large enough to give rise to a discharge breakdown between the paired comb-teeth-shaped electrodes. It is thus possible to prevent a discharge breakdown in the IDT electrode.

Also, because the resistor is made of a semiconductor, the resistivity can be controlled as needed with a quantity of a contained additive or composition variation, and therefore the resistivity can be set adequately. For this reason, the shape of the resistor can be compact and not too narrow. It is thus possible to prevent the occurrence of a problem, such as a burnout of the resistor, and hence to achieve a compact, highly reliable surface acoustic wave apparatus.

Also, according to the invention, the semiconductor is a 14 group semiconductor, for example, silicon. A intrinsic silicon has a resistivity of approximately 3000 Ω·m at normal temperature, which is satisfactory high, and it is therefore easy to obtain resistivity in a wide range with a change in quantity of a contained additive. Also, because silicon is highly stable and has an excellent adhesiveness with respect to the piezoelectric substrate, the reliability of the surface acoustic wave apparatus can be enhanced. Also, because a silicon film can be formed easily with accuracy by means of vapor deposition, sputtering, etc., it is possible to fabricate a highly reliable surface acoustic wave apparatus at a low cost.

Further, according to the invention, the aforementioned Si includes at least one element selected from B, Al, Ga, In, P, As, and Sb as a dopant. These elements have a high solubility limit with respect to silicon, and therefore can be doped therein in a large quantity. Also, because these elements are trivalent or pentavalent while silicon is tetravalent, they can be suitably used as additives to be doped. This enables resistivity in a wide range to be readily achieved.

Also, the semiconductor may be a 12 (former IIB)–16 (former VIB) group semiconductor, or the semiconductor may be an oxide semiconductor.

Further, according to the invention, the resistance value between the comb-teeth-shaped electrode to be at the signal potential in the IDT electrode and the electrode to be at the ground potential is set to 30 M$\Omega$ or below. It is thus possible to prevent the occurrence of a discharge breakdown in a reliable manner.

Furthermore, according to the invention, the resistance value between the comb-teeth-shaped electrode to be at the signal potential in the IDT electrode and the electrode to be at the ground potential is set to 2 k$\Omega$ or above. It is thus possible to suppress deterioration of the electric characteristic of the surface acoustic wave apparatus within an allowance.

In addition, by setting the resistance value between the comb-teeth-shaped electrode to be at the signal potential in the IDT electrode and the electrode to be at the ground potential to 20 k$\Omega$ or above, it is possible to prevent the occurrence of a discharge breakdown in a reliable manner without deteriorating the electric characteristic of the surface acoustic wave apparatus.

Also, the surface acoustic wave apparatus of the invention is formed by directly connecting the paired comb-teeth-shaped electrodes forming the IDT electrode to each other via the resistor formed on the piezoelectric substrate, and the resistor is made of a semiconductor.

According to this configuration, too, because the paired comb-teeth-shaped electrodes forming the IDT electrode are electrically connected to each other via the resistor, charges induced by the pyroelectric effect due to an abrupt change in temperature or the like move through the resistor, which prevents the generation of a potential difference large enough to give rise to a discharge breakdown between the paired comb-teeth-shaped electrodes.

Also, because the resistor is made of a semiconductor, the resistivity can be controlled as needed with a quantity of a contained additive, and therefore the resistivity can be set adequately. It is thus possible to prevent the occurrence of a problem, such as a burnout of the resistor, and hence to achieve a compact, highly reliable surface acoustic wave apparatus.

Also, according to the invention, the semiconductor is a 14 group semiconductor, for example, silicon. Silicon is generally formed on the IDT electrode to form a passivation film that protects the IDT electrode. A intrinsic silicon has a resistivity of approximately 3000 $\Omega$·m at normal temperature, which is satisfactory high, and it is therefore easy to obtain resistivity in a wide range with a change in quantity of a contained additive. Boron (B) can be employed as the additive, for example.

Further, according to the invention, the aforementioned Si includes at least one element selected from Sb, Ti, and Al as a dopant. These elements are contained in the electrodes or solder, and diffuse into Si forming the passivation film during the fabrication process of the surface acoustic wave apparatus. Because these elements are trivalent or pentavalent while silicon is tetravalent, they can be suitably used as additives to be doped. This enables resistivity in a wide range to be readily achieved.

Also, the semiconductor may be a 12–16 group semiconductor, or the semiconductor may be an oxide semiconductor.

The resistor made of an oxide semiconductor or the like is formed on the piezoelectric substrate during the fabrication process of the surface acoustic wave apparatus, and provides electrical conduction between the oppositely paired comb-teeth-shaped electrodes. This eliminates the need for an additional step of forming a resistor, which in turn makes it possible to avoid an increase of the manufacturing costs of the surface acoustic wave apparatus.

The oxide semiconductor can be at least one kind selected from $TiO_2$, $CuO$, $Cu_2O$, $CuAlO_2$, $NiO$, and $Nb_2O_3$. These are the oxide semiconductors formed as the components in the electrodes or the components in the piezoelectric substrate undergo oxidation during the plasma step in a plasma atmosphere including oxide or the like.

A dopant for the $TiO_2$ can be at least one element selected from Sb, F, Cl, N, Cr, Pd, Ta, Ni, and Cu. These elements are contained in the electrodes or an etching gas, and enter into $TiO_2$, which is an oxide semiconductor, during the fabrication process of the surface acoustic wave apparatus. The resistance value of $TiO_2$ can be lowered either by displacing Ti or O or by narrowing the band gap. This enables the resistivity in a wide range to be readily achieved.

Also, a communications device of the invention includes: a switching circuit or a duplexer circuit, connected to an antenna terminal, to switch transmission to reception and vice versa; a power amplifier circuit, connected to the switching circuit or the duplexer circuit, to amplify a transmission signal; and a filter, inserted in a signal path from the power amplifier circuit to the antenna terminal, to attenuate an unwanted wave component in the transmission signal, and the filter is formed by using the surface acoustic wave apparatus.

By adopting the surface acoustic wave apparatus of the invention as a filter, it is possible to provide a compact, highly reliable communications device.

DETAILED DESCRIPTION OF THE INVENTION

Figure 1:
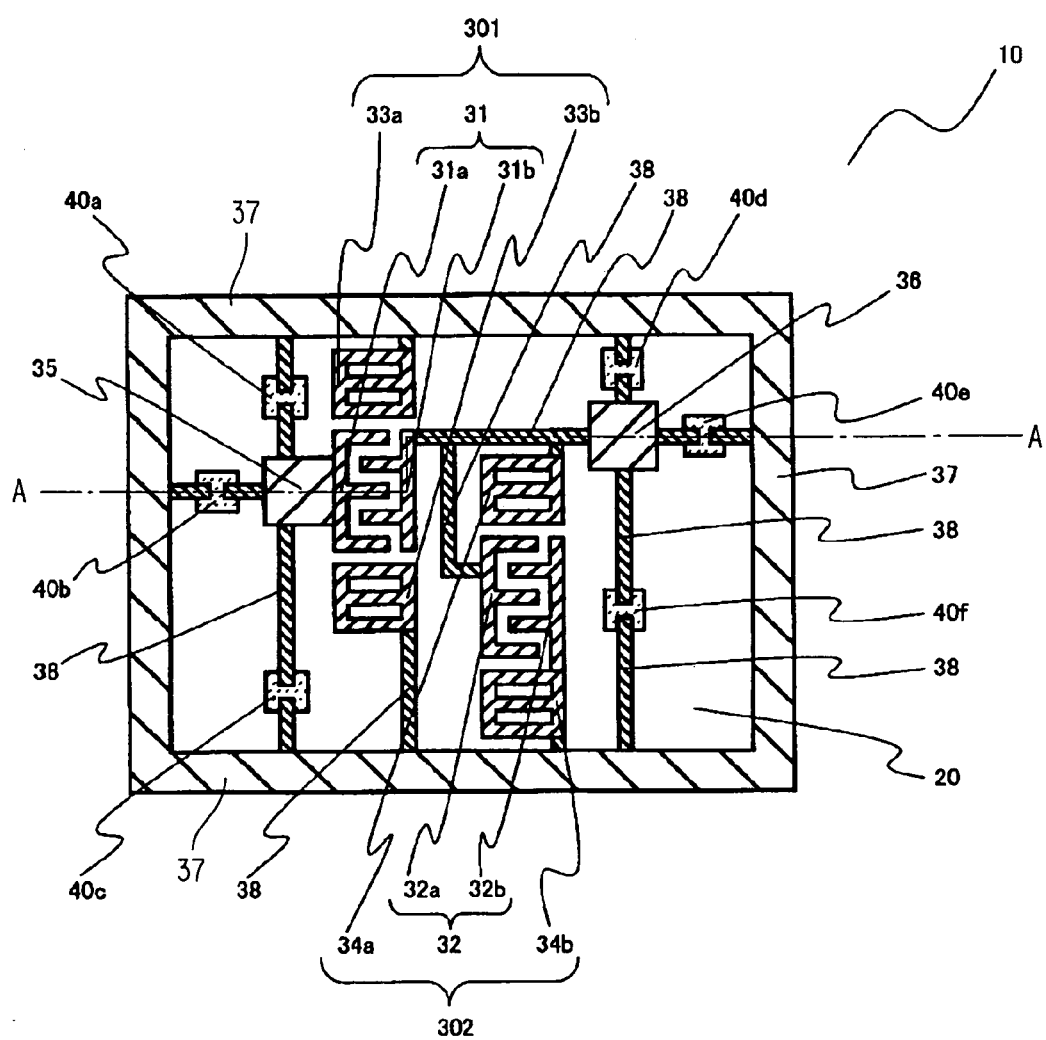
FIG. 1 is a plan view schematically showing the structure of electrodes in a surface acoustic wave element used in a surface acoustic wave apparatus of the invention.
Figure 2:
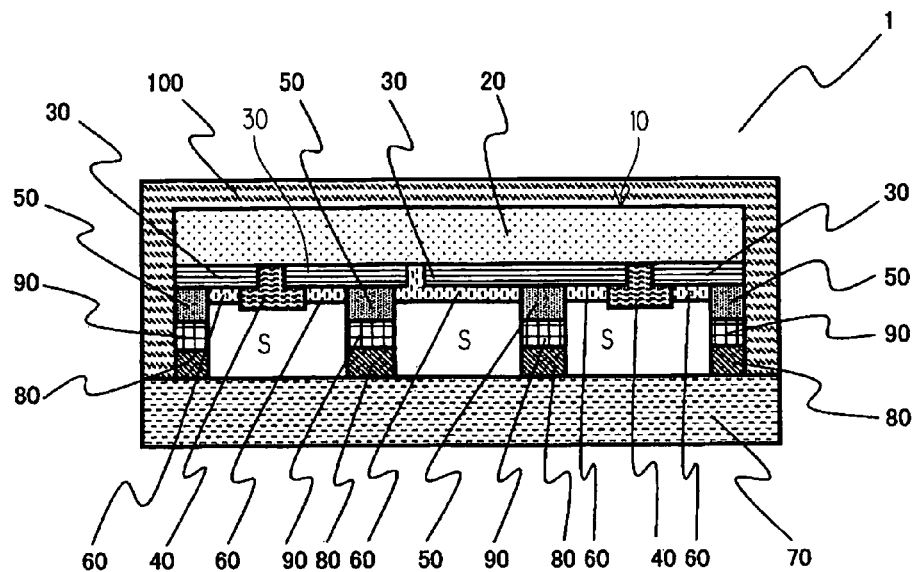
FIG. 2 is a cross section taken along the line A—A, schematically showing the sectional structure of the surface acoustic wave apparatus.

FIG. 1 is a plan view schematically showing a surface acoustic wave element used in a surface acoustic wave apparatus of the invention. FIG. 2 is a cross section taken along the line A—A, schematically showing the sectional structure of the surface acoustic wave apparatus of the invention.

Referring to FIG. 1 and FIG. 2, numeral 10 is a surface acoustic wave element. Numeral 1 is a surface acoustic wave apparatus and numeral 70 is a circuit board.

The surface acoustic wave element 10 comprises: a piezoelectric substrate 20 made of a piezoelectric single crystal, such as a single crystal of lithium tantalate, a single crystal of lithium niobate, and a single crystal of lithium tetraborate; resonators 301 and 302, formed on one main surface of the piezoelectric substrate 20, to function with the use of a surface acoustic wave; and resistors 40a through 40f formed also on the same main surface of the piezoelectric substrate 20.

Electrodes forming the resonators 301 and 302 are made of aluminum or aluminum-based alloy.

As is shown in FIG. 1, the resonators 301 and 302 are formed from: IDT electrodes 31 and 32 that excite a surface acoustic wave; reflector electrodes 33 and 34 placed on the both sides of the IDT electrodes 31 and 32, respectively, along the propagation direction of a surface acoustic wave; an input pad electrode 35 and an output pad electrode 36 that are electrically connected to the IDT electrodes 31 and 32; a grounding annular electrode 37 connected to the ground potential; and connection electrodes 38 that interconnect the respective electrodes.

The IDT electrode 31 comprises comb-teeth-shaped electrodes 31a and 31b, each being formed from a strip-shaped common electrode and plural electrode fingers extending in a direction orthogonal with respect to the common electrode, placed oppositely in such a manner that their electrode fingers fit with each other.

Paired reflector electrodes 33a and 33b are placed respectively on the both outsides of the IDT electrode 31 along the propagation direction of a surface acoustic wave.

The resonator 301, provided with a single terminal pair (hereinafter, referred to as the single terminal pair resonator), comprises the paired reflector electrodes 33a and 33b and the IDT electrode 31 placed in between.

Likewise, the IDT electrode 32 comprises paired comb-teeth-shaped electrodes 32a and 32b placed oppositely. Paired reflector electrodes 34a and 34b are placed respectively on the both outsides of the IDT electrode 32 along the propagation direction of a surface acoustic wave.

The single terminal pair resonator 302 comprises the paired reflector electrodes 34a and 34b and the IDT electrode 32 placed in between.

Referring to FIG. 1, the comb-teeth-shaped electrode 31a is connected to the input pad electrode 35, and the comb-teeth-shaped electrode 31b is connected to the output pad electrode 36 via the connection electrode 38. Both the comb-teeth-shaped electrodes 31a and 31b will be at a signal potential.

The comb-teeth-shaped electrode 31a is electrically connected to the grounding annular electrode 37 via the input pad electrode 35, the connection electrode 38, and the resistors 40a, 40b and 40c.

The comb-teeth-shaped electrode 31b is electrically connected to the grounding annular electrode 37 via the connection electrode 38, the output pad electrode 36, and the resistors 40d, 40e, and 40f.

The comb-teeth-shaped electrode 31a is thus electrically connected to the comb-teeth-shaped electrode 31b via the resistors 40a, 40b, 40c, 40d, 40e, and 40f.

Also, the comb-teeth-shaped electrode 32a is connected to the output pad electrode 36 via the connection electrode 38. The comb-teeth-shaped electrode 32a will be therefore at a signal potential.

The comb-teeth-shaped electrode 32b is connected to the grounding annular electrode 37 via the reflector electrode 34b and the connection electrode 38, and will be therefore at a ground potential.

Because the comb-teeth-shaped electrode 32a is electrically connected to the grounding annular electrode 37 via the connection electrode 38, the output pad electrode 36, and the resistors 40d, 40e, and 40f, the comb-teeth-shaped electrode 32a is electrically connected to the comb-teeth-shaped electrode 32b via the resistors 40d, 40e, and 40f.

Figure 3:
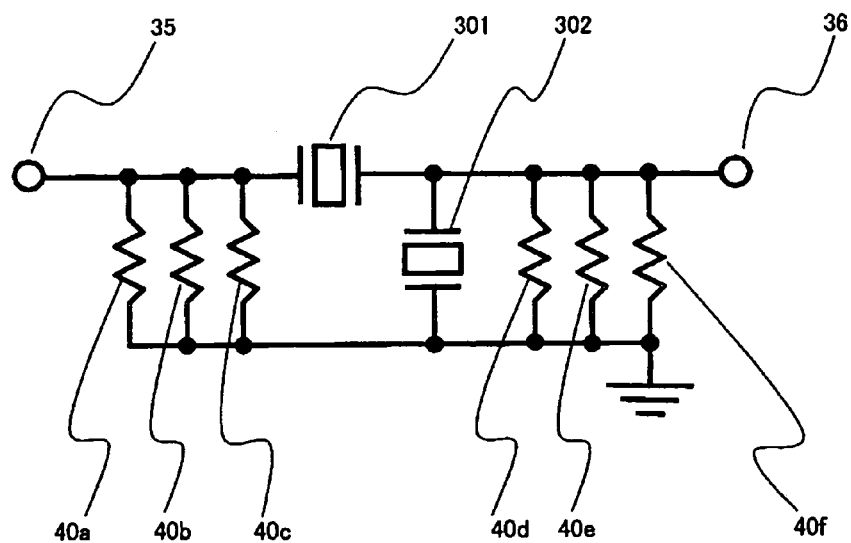
FIG. 3 is a view showing the electrical equivalent circuit of the surface acoustic wave apparatus.

FIG. 3 is an electrical equivalent circuit diagram of the surface acoustic wave element. The surface acoustic wave element includes the single terminal pair resonator 301 connected in series between the input pad electrode 35 and the output pad electrode 36, and the single terminal pair resonator 302 connected between the input/output and the GND. The resistors 40a, 40b, and 40c are connected in parallel between the input pad electrode 35 and the ground potential, and the resistors 40d, 40e, and 40f are connected in parallel between the output pad electrode 36 and the ground potential. This enables a ladder type filter to be formed.

As has been described, because the paired comb-teeth-shaped electrodes forming the IDT electrode are electrically connected to each other via the resistors, charges induced by the pyroelectric effect at an abrupt change in temperature or the like move via the resistors in such a manner so as to cancel out a charge-induced potential difference. This forestalls the generation of a potential difference large enough to give rise to a discharge breakdown between the paired comb-teeth-shaped electrodes, which in turn makes it possible to prevent a discharge breakdown in the IDT electrode.

Also, in the surface acoustic wave element of this embodiment, not only the paired comb-teeth-shaped electrodes, but also all the electrodes including the reflector electrodes are electrically interconnected, either directly or via the resistors. It is thus possible to prevent a discharge breakdown between arbitrary electrodes, for example, between the IDT electrode and the reflector electrode.

Further, the grounding annular electrode is connected to the ground potential while the surface acoustic wave apparatus is operating. Because all the electrodes are connected to the ground potential via the grounding annular electrode or the resistors, charges induced by the pyroelectric effect can be released to the ground swiftly, which makes it possible to provide a stable, highly reliable surface acoustic wave apparatus with respect to a change in temperature.

In this embodiment of the invention, the resistors 40a through 40f are made of a 14 (former IVB) group semiconductor material, a 13 (former IIIB)–15 (former VB) group semiconductor material, or a 12–16 group semiconductor material. The semiconductor material can be single crystal, polycrystal, or amorphous material. The resistance value is adjusted by adding an additive to these semiconductors.

For example, in the case of a 14 group semiconductor, such as silicon, one or more than one kind of additive selected from B, Al, Ga, In, P, As, Sb, etc. is used. The resistivity of the resistors can be controlled to a desired value according to a content of these additives.

By providing the resistors between the connection electrodes 38, the shape of the resistors can be smaller, which makes it possible to provide a compact, highly reliable surface acoustic wave apparatus.

In addition, semiconductor materials have a property that the resistivity decreases as the temperature rises. Hence, even when the temperature rises abruptly, the resistance value of the resistors decreases, which allows charges induced by the pyroelectric effect to move swiftly. Also, even when a large current flows through the resistors and the temperature of the resistors rises further, the resistance value of the resistors decreases further and generation of heat is suppressed. Hence, an excessive rise in temperature of the resistors can be prevented, which in turn makes it possible to prevent the occurrence of a problem, such as a break in the resistors.

When the resistance value of the resistors is too large, the effect of preventing a discharge breakdown in the IDT electrode is reduced; conversely, when the resistance value of the resistors is too small, the electric characteristic of the surface acoustic wave apparatus is deteriorated. It is thus necessary to set the resistance value of the resistors appropriately in response to the electric characteristic needed for the surface acoustic wave apparatus.

Initially, in terms of preventing a discharge breakdown, by setting the resistance value between the oppositely paired comb-teeth-shaped electrodes forming the IDT electrode to 30 MΩ or below, it is possible to prevent a discharge breakdown between the comb-teeth-shaped electrodes in a reliable manner.

Also, in terms of the electric characteristic, by setting the resistance value between the electrode to be at the signal potential and the electrode to be at the ground potential to 2 kΩ or above, it is possible to control a signal leaking toward the ground potential to be within an allowance, which in turn makes it possible to maintain deterioration of the electric characteristic at a level at or below which no practical problem occurs.

Further, by setting the resistance value between the electrode to be at the signal potential and the electrode to be at the ground potential to 20 kΩ or above, it is possible to suppress a signal leaking toward the ground potential at a negligible level, which in turn makes it possible to eliminate deterioration of the electric characteristic.

The sectional structure of the surface acoustic wave apparatus of the invention will now be described with reference to FIG. 2.

Referring to FIG. 2, electrodes formed on the piezoelectric substrate 20, including the IDT electrodes 31 and 32, the reflector electrodes 33 and 34, the input and output pad electrodes 35 and 36, the grounding annular electrode 37, and the connection electrodes 38, are collectively denoted by numeral 30. The resistors 40a through 40f are also collectively denoted by numeral 40.

As is shown in FIG. 2, a conductor film 50 is formed on the electrodes 30 at portions where the input and output pad electrodes 35 and 36 and the grounding annular electrode 37 are present. Also, a passivation film 60 is formed on one main surface of the piezoelectric substrate 20. The passivation film 60 covers the piezoelectric substrate 20 and the electrodes 30, but the conductor film 50 is exposed therefrom.

The conductor film 50 on the surface acoustic wave element 10 formed as described above is connected to connection electrodes 80 formed on the mounting surface of the circuit board 70 via solder bumps 90.

The surface acoustic wave element 10 is thus electrically and mechanically connected to the circuit board 70. At the same time, spaces S between one main surface of the surface acoustic wave element 10 and the mounting surface of the circuit board 70 are sealed hermetically.

Although it is not shown in FIG. 2, an external terminal electrode is formed on the bottom surface of the circuit board 70, and the external terminal electrode and the respective connection electrodes 80 are electrically connected to various elements forming a communications device, via a wiring pattern formed on the surface or in the interior of the circuit board 70.

Resin 100 is then formed on the other main surface and the peripheral surfaces of the surface acoustic wave element 10 in order to prevent damages to the surface acoustic wave element 10. The height of the spaces S between the surface of the circuit board 70 and the surfaces of the resonators 301 and 302 is set to a length equal to or longer than the wavelength of a surface acoustic wave generated in the surface acoustic wave element 10, and vibration spaces are thereby secured.

Figure 4:
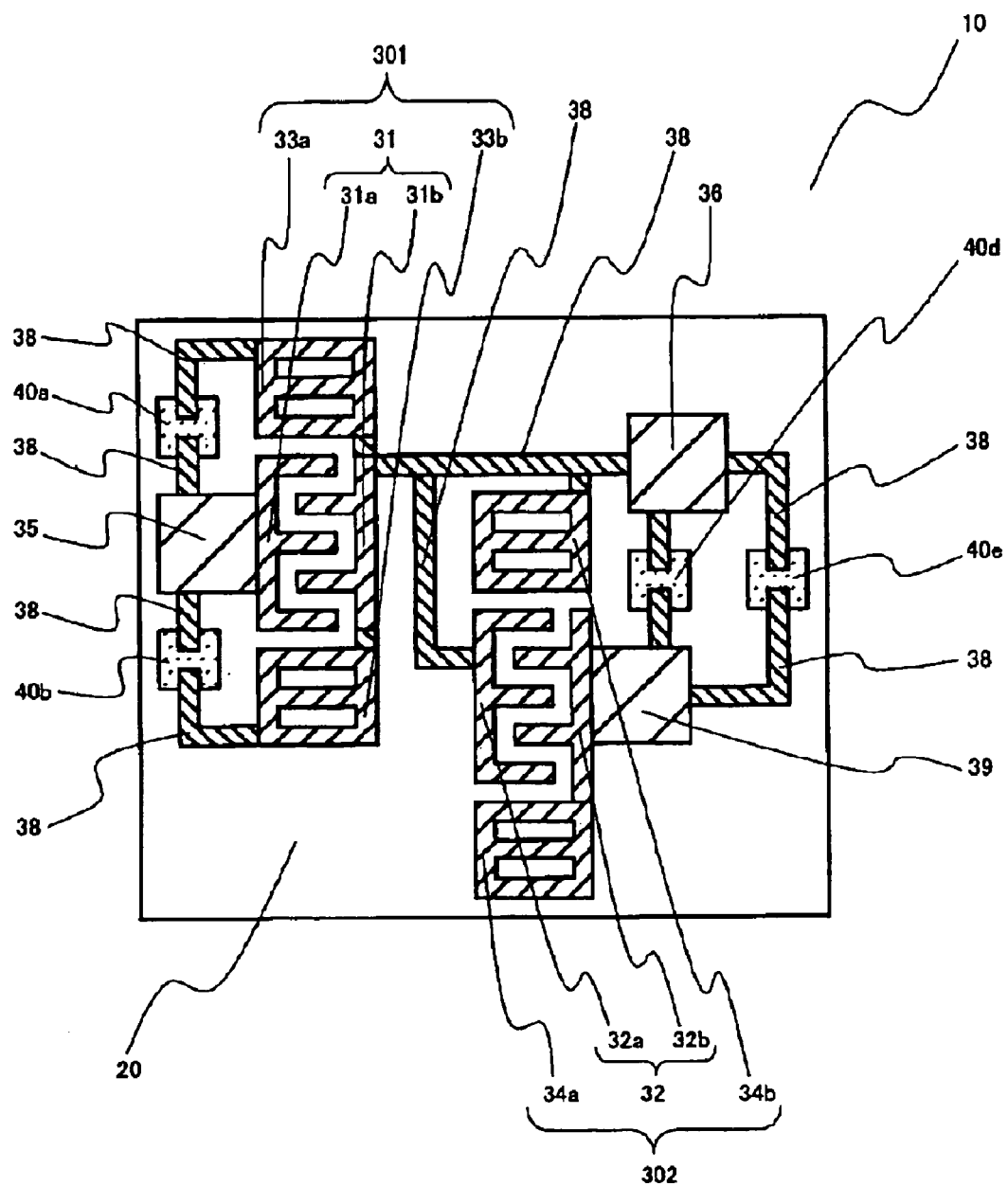
FIG. 4 is a plan view schematically showing another structure of electrodes in the surface acoustic wave element.

FIG. 4 is a plan view schematically showing another structure of electrodes in the surface acoustic wave element 10 of the invention.

This surface acoustic wave element 10 omits a grounding annular electrode.

As with the surface acoustic wave element of the embodiment above, a single terminal pair resonator 301 comprises an IDT electrode 31 and reflector electrodes 33a and 33b, while a single terminal pair resonator 302 comprises an IDT electrode 32 and reflector electrodes 34a and 34b, and a ladder type filter is formed from these two single terminal pair resonators 301 and 302.

Referring to FIG. 4, a comb-teeth-shaped electrode 31a, connected to an input pad electrode 35 so as to be at a signal potential, is electrically connected to a comb-teeth-shaped electrode 31b, connected to an output pad electrode 36 via a connection electrode 38 so as to be at the signal potential, via connection electrodes 38, the reflector electrodes 33a and 33b, resistors 40a and 40b, and the input pad electrode 35.

Likewise, a comb-teeth-shaped electrode 32a, connected to the output pad electrode 36 via the connection electrode 38 so as to be at the signal potential, is electrically connected to a comb-teeth-shaped electrode 32b, connected to a grounding pad electrode 39 so as to be at a ground potential, via the connection electrodes 38, the output pad electrode 36, the grounding pad electrode 39, and resistors 40*d* and 40*e*.

As has been described, all the electrodes are electrically interconnected, either directly or via the resistors 40, which make it possible to prevent a discharge breakdown among all the electrodes.

Figure 5:
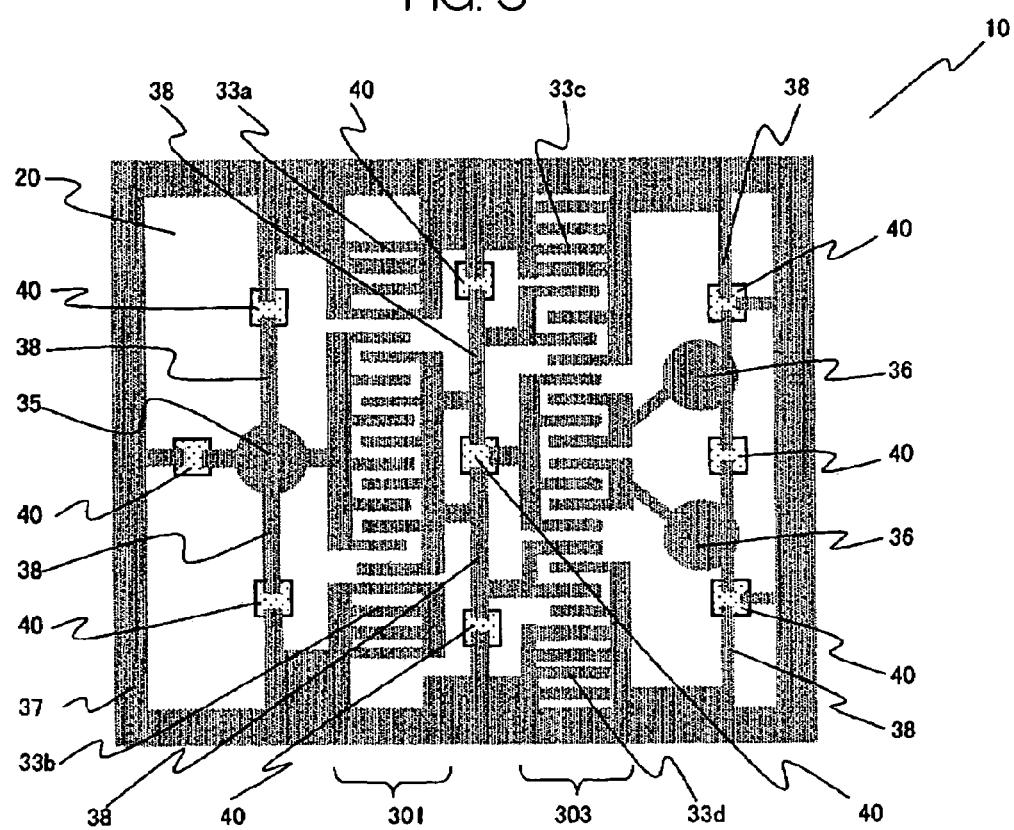
FIG. 5 is a plan view schematically showing still another structure of electrodes in the surface acoustic wave element.

FIG. 5 is a plan view schematically showing still another structure of electrodes in the surface acoustic wave element 10 of the invention.

In this surface acoustic wave element 10, a single terminal pair resonator 301 comprises reflector electrodes 33*a* and 33*b* and an IDT electrode placed in between, while a double-mode surface acoustic wave filter 303 comprises reflector electrodes 33*c* and 33*d* and plural IDT electrodes placed in between. The single terminal pair resonator 301 is cascade-connected to the double-mode surface acoustic wave filter 303 between an input pad electrode 35 and output pad electrodes 36.

Referring to FIG. 5, oppositely paired comb-teeth-shaped electrodes are also electrically connected to each other via resistors 40, which prevent a discharge breakdown between the comb-teeth-shaped electrodes. Further, all the electrodes, including the reflector electrodes, are electrically interconnected, either directly or via the resistors 40, which makes it possible to prevent a discharge breakdown among all the electrodes.

In the embodiments described above, one comb-teeth-shaped electrode is electrically connected to the other comb-teeth-shaped electrode via the resistors 40 provided between the connection electrodes 38.

It should be appreciated, however, that the oppositely paired comb-teeth-shaped electrodes may be electrically connected to each other directly by forming a resistor in between.

Figure 6:
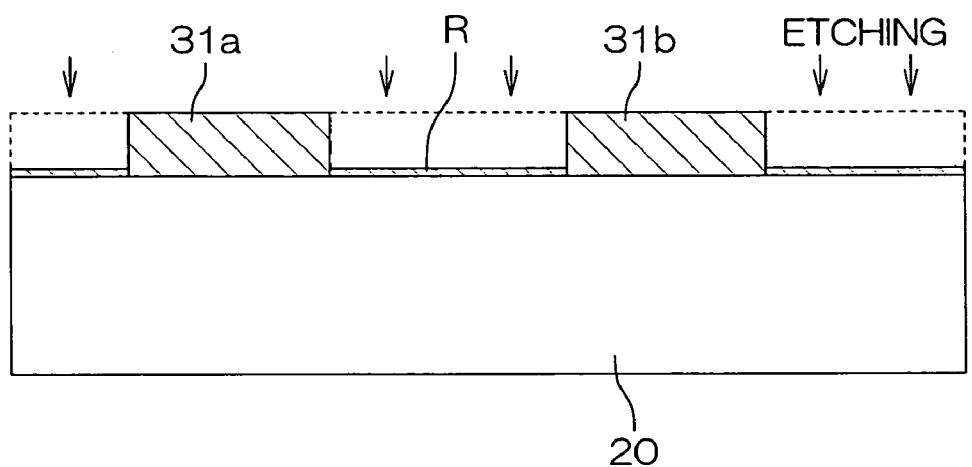
FIG. 6 is a cross section showing a state where a thin-film resistor R made of a semiconductor material is formed between comb-teeth-shaped electrodes 31a and 31b formed on a piezoelectric substrate 20.
Figure 7A:
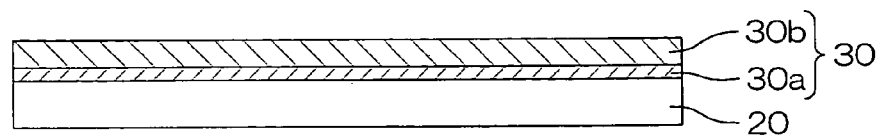
FIG. 7(a) through FIG. 7(e) are views showing the fabrication process after an electrode film 30 is deposited on the piezoelectric substrate 20, from the step of forming electrodes by etching the electrode film 30 to a specific pattern to the step of forming a passivation film 60 on the electrodes.
Figure 7B:
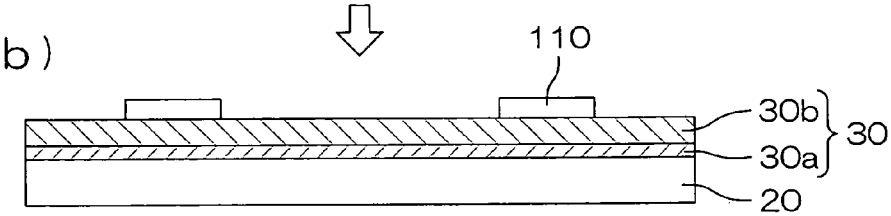
Figure 7C:
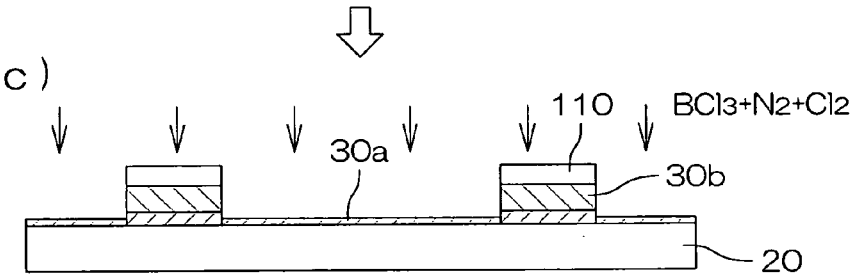
Figure 7D:
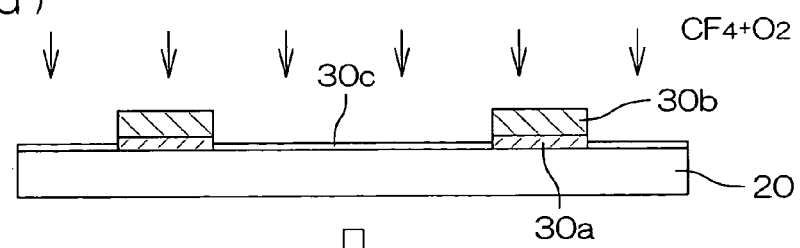
Figure 7E:
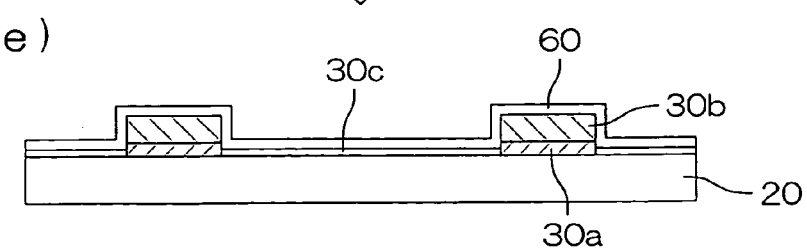

FIG. 6 is a cross section showing a state where a thin-film resistor R made of a semiconductor material is formed between comb-teeth-shaped electrodes 31*a* and 31*b* formed on the piezoelectric substrate 20.

The resistor R can be formed when an electrode film 30, from which the comb-teeth-shaped 31*a* and 31*b* are formed, is deposited and the electrode film 30 is etched into a specific pattern.

A semiconductor material can be a 14 group semiconductor material, a 13–15 group semiconductor material, a 12–16 group semiconductor material or an oxide semiconductor. The semiconductor material can be single crystal, polycrystal, or amorphous material. The resistance value is adjusted by adding an additive to these semiconductors.

For example, in the case of the 14 group semiconductor, such as silicon, one or more than one kind of additive selected from B, Sb, Ti, Al, etc. is used. The resistivity of the resistor can be controlled to a desired value according to a content of these additives.

As the oxide semiconductor, one or more than one kind of semiconductor selected from $TiO_2$, CuO, $Cu_2O$, $CuAlO_2$, NiO, $Nb_2O_3$, etc. can be used.

In particular, when $TiO_2$ is used, one or more than one kind of additive selected from Sb, F, Cl, N, Cr, Pd, Ta, Ni, Cu, etc. can be added.

The method of forming the thin-film resistor R from the foregoing semiconductors will now be described.

FIG. 7(*a*) through FIG. 7(*e*) are views showing the fabrication process after the electrode film 30 is deposited on the piezoelectric substrate 20, from the step of forming electrodes by etching the electrode film 30 into a specific pattern to the step of forming a passivation film on the electrodes.

Initially, a Ti film 30*a* is formed on the piezoelectric substrate 20, and an Al-based alloy film 30*b* is formed thereon (FIG. 7(*a*)). The Ti film 30*a* is an under layer of the Al-based alloy film 30*b*, which is formed in order to enhance the adhesion between the piezoelectric substrate 20 and the Al-based alloy film 30*b* and to improve orientation of the Al-based alloy film 30*b*.

A resist pattern is then formed on the electrode film 30 (FIG. 7(*b*)).

The electrode film 30 is then etched within a plasma chamber. For example, a mixed gas of $BCl_3$, $N_2$, and $Cl_2$ is used as an etching gas. The etching time is a sum of a time needed for the Al-based alloy film 30*b* to be etched away completely and an extra time. In other words, the etching is continued for a while after emission spectrum of Al becomes weak and the Al-based alloy film 30*b* has been etched away. This can slightly leave the Ti film 30*a* beneath the Al-based alloy film 30*b* (FIG. 7(*c*)). When the extra time is too long, the Ti film 30*a* is etched away completely, and no resistor will be formed.

In the course of this etching, Cl and N in the gas used for the etching may be left on the surface of the piezoelectric substrate 20, and may diffuse into the Ti film 30*a*. The Ti film 30*a* added with Cl and N is thus formed.

The resist film is then removed within the plasma chamber. A gas used in this instance is, for example, a mixed gas of $CF_4$ or $C_2F_6$ and $O_2$. The substrate temperature at this point is about 155° C. During this step, Ti in the Ti film 30*a* is oxidized by plasma, and a $TiO_2$ film 30*c* is thereby formed between the electrodes (FIG. 7(*d*)). The $TiO_2$ film can be a single crystal, a multi crystal, or an amorphous material.

In this instance, F in the etching gas may be added to the $TiO_2$ film. Also, Cl and N are added to the $TiO_2$ film. These elements, Cl, N, and F, may displace O in $TiO_2$, and possibly lower the resistivity of the $TiO_2$ film.

Elements added to the $TiO_2$ film are not limited to the foregoing Cl, N and F. During the sequence, N in air may be absorbed in the substrate. Then, N may diffuse into the $TiO_2$ film when heated at the time of photolithography or the like, and therefore possibly lower the resistivity. Also, Cr contained in the connection pad electrode narrows a band gap when it enters into $TiO_2$, and lowers the resistivity. Moreover, Pd added to Au forming wires and pads in order to increase the hardness of Au, or Sb added to the solder displaces Ti and lowers the resistivity of $TiO_2$. Furthermore, Ta of the piezoelectric substrate 20, Ni used as a diffusion preventing film on the connection pad electrode, or Cu used as an additive to the electrodes displaces Ti when it enters into $TiO_2$, and lowers the resistivity of $TiO_2$. In addition, in a case where $LiTaO_3$ is used in the piezoelectric substrate 20, Ta may possibly lower the resistivity of $TiO_2$ as it diffuses into $TiO_2$ and displaces Ti.

After the $TiO_2$ film 30*c* is formed, a passivation film made of Si or $SiO_2$ is deposited (FIG. 7(*e*)). The method of film deposition can be any of CVD, sputtering, electron beam evaporation, etc.

The $TiO_2$ film 30*c* formed between the electrodes is made of an oxide semiconductor, to which elements, such as Cl, N, and F, are added as described above. The concentration of the additives can be set to an adequate value by adjusting the composition ratio of the etching gas and the substrate temperature. It is thus possible to adjust the resistivity of the resistor to a desired value according to a content ratio of these additives.

Semiconductors have a property that the resistivity decreases as the temperature rises, as described above. Hence, even when the temperature of the resistor rises, the resistance value of the resistor decreases, which allows charges induced by the pyroelectric effect to move swiftly.

As has been described, in terms of preventing a discharge breakdown, it is preferable to set the resistance value of the resistor between the oppositely paired comb-teeth-shaped electrodes forming the IDT electrode to 30 MΩ or below, and to 2 kΩ or above, and more preferably to 20 kΩ or above, in terms of the electric characteristic of the surface acoustic wave apparatus.

The above description has described, with reference to FIG. 7(a) through FIG. 7(e), that a resistor made of an oxide semiconductor, $TiO_2$, can be formed between the electrodes in the etching step to form Ti/Al alloy electrodes 30 of a specific pattern.

It should be noted, however, that materials that can form a resistor between the electrodes are not limited to $TiO_2$.

For example, Cu may be used instead of Ti for under layer on the electrodes. In the case of Cu/Al alloy electrodes, in which a Cu film is formed on the piezoelectric substrate 20 and an Al alloy film is further formed thereon, a Cu thin film or an Al—Cu thin film is left on the piezoelectric substrate 20 as etching residues. The Cu thin film or the Al—Cu thin film undergoes oxidation during the plasma step and thereby forms a 12–16 group semiconductor: $CuO$, $Cu_2O$, or $CuAlO_2$. The resulting $CuO$, $Cu_2O$, or $CuAlO_2$ is a p-type oxide semiconductor having preferable resistivity.

Also, there may be a case where Cu—Al electrodes including Cu are used without forming a Cu film on the piezoelectric substrate 20 as under layer. In this case, Cu or Al—Cu in the electrodes remains on the piezoelectric substrate 20 during the etching process to form the electrodes. The Cu or Al—Cu film thus formed undergoes oxidation during the plasma step and thereby forms an oxide semiconductor: $CuO$, $Cu_2O$, or $CuAlO_2$. The resulting $CuO$, $Cu_2O$, or $CuAlO_2$ is a p-type semiconductor having preferable resistivity.

Also, in a case where $LiNbO_3$ is used in the piezoelectric substrate 20, Li falls off from the surface of the piezoelectric substrate 20 during the etching step and a $Nb_2O_3$ film is formed on the surface of the piezoelectric substrate 20. The resulting $Nb_2O_3$ is an n-type semiconductor having preferable resistivity and electric conduction between the electrodes is thereby enabled.

The above description described an example where a resistor is formed on the surface of the piezoelectric substrate 20, and this resistor enables electrical conduction between the electrodes. However, there may be a case where an additive gets mixed into the passivation film formed on the electrodes, and electrical conduction between the electrodes is enabled via the passivation film.

Figure 8:
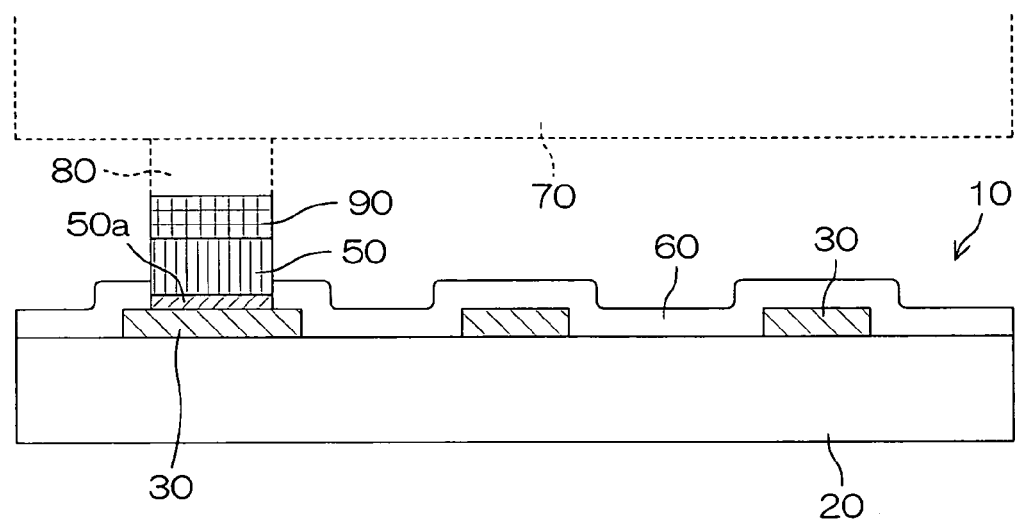
FIG. 8 is a cross section of a surface acoustic wave element 10, showing a state where a conductor film 50 is formed on pad electrodes 30 on one main surface of the piezoelectric substrate 20.

FIG. 8 is a cross section of the surface acoustic wave element 10. The electrodes 30 are formed one main surface of the piezoelectric substrate 20 and the passivation film 60 is formed thereon. The passivation film 60 is made of Si.

Formed on part of the electrode 30 is the conductor film 50 used to establish a connection with the connection electrode 80 formed on the mounting surface of the circuit board 70 via the solder bump 90. The conductor film 50 is made of, for example, Au. The solder bump 90 is made of, for example, high melting point solder, SnSb or SnAgCu.

A Ti film 50a is formed on the conductor film 50 on the contact surface to the electrode 30 to improve adhesion to the electrode 30.

The passivation film 60 is formed by means of CVD, sputtering, electron beam evaporation, etc., and the Ti film 50a and the conductor film 50 are formed by the lift-off method after the passivation film 60 is deposited.

Ti diffuses into Si in the passivation film 60 while the Ti film 50a is being formed, and this turns the passivation film 60 to an n-type Si doped with an impurity, Ti. Also, Al in the electrode 30 diffuses into the passivation film 60, and this turns the passivation film 60 to a p-type Si doped with an impurity Al.

Further, the conductor film 50 is connected to the connection electrode 80 via the solder bump 90 when the surface acoustic wave element 10 is mounted to the circuit board 70, and Sb in the solder diffuses into the passivation film 60 while the solder bump 90 is being connected. This turns the passivation film 60 to an n-type Si doped with an impurity, Sb.

The resistivity of Si decreases as Si in the passivation film 60 turns to the p-type Si or the n-type Si as has been described above, and the passivation film 60 thereby functions as a resistor between the electrodes 30. The electrodes 30 are thus electrically connected to each other, which makes it possible to prevent a discharge breakdown between the electrodes.

In particular, because semiconductor materials have a property that the resistivity decreases as the temperature rises, even when the temperature rises abruptly, the resistance value of the resistor decreases, which allows the charges induced by the pyroelectric effect to move swiftly. Also, even when a large current flows through the resistor and the temperature of the resistor rises further, the resistance value of the resistor decreases further and generation of heat is suppressed. Hence, an excessive rise in temperature of the resistor can be prevented, which in turn makes it possible to prevent the occurrence of a problem, such as a break in the resistor.

An example where the surface acoustic wave apparatus 1 of the invention as described above is mounted to a communications device will now be described.

Figure 9:
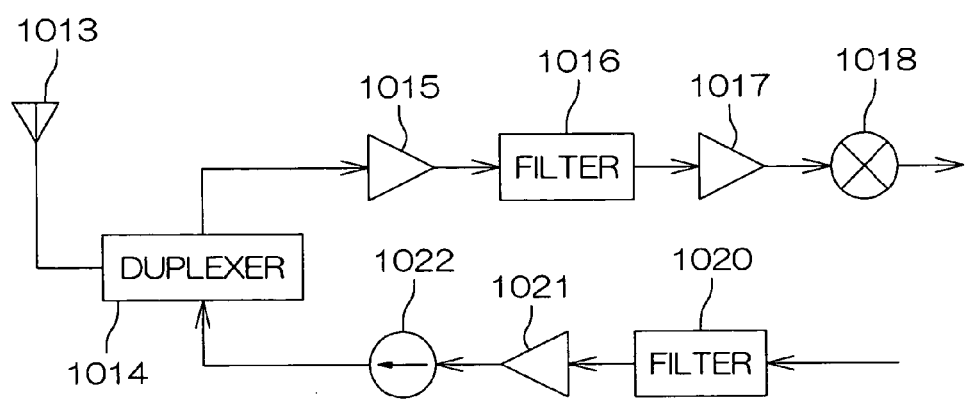
FIG. 9 is a block diagram of a ratio frequency circuit portion in a mobile phone adopting the surface acoustic wave apparatus of the invention.

FIG. 9 is a block diagram of a ratio frequency circuit in a mobile phone. An unwanted signal is removed from a ratio frequency signal to be transmitted in a filter 1020, and the resulting signal is amplified in a power amplifier 1021, after which the signal passes through an isolator 1022 and a duplexer circuit 1014 to be emitted from an antenna 1013. Also, a ratio frequency signal received at the antenna 1013 passes through the duplexer circuit 1014 and is amplified in a low-noise amplifier 1015. After an unwanted signal is removed in a filter 1016, the resulting signal is amplified again in an amplifier 1017 and converted to a intermediate frequency signal in a mixer 1018.

The surface acoustic wave apparatus 1 of the invention is adapted to the filter 1020 and the filter 1016. Further, in a system, such as CDMA, in which frequencies are divided for transmission and reception, the duplexer circuit 1014 is a duplexer comprising a filter, and a filter using the surface acoustic wave apparatus of the invention can be adapted thereto. In a system, such as GSM, in which transmission and reception are time-divided, the duplexer circuit 1014 comprises a switch, and a filter is not needed in many cases.

As today's mobile phone keeps reducing in size, intervals among components mounted thereon are becoming smaller, and the filter 1020 and the filter 1016, each comprising the surface acoustic wave apparatus, receive heat transmitted from the power amplifier 1021, which raises the temperature of the electrodes. Also, in a case where the duplexer circuit 1014 comprises a surface acoustic wave filter, the temperature of the electrodes rises due to heat generated by an input signal amplified in the power amplifier 1021. The heat thus generated makes the duplexer using the surface acoustic wave filter or the surface acoustic wave apparatus susceptible to a discharge breakdown due to pyroelectricity.

By adapting the invention to such a surface acoustic wave apparatus, it is possible to achieve a surface acoustic wave apparatus in which no discharge breakdown takes place.

It should be appreciated that the invention is not limited to the embodiments above, and can be changed and modified in various manners without deviating from the scope of the invention.

For example, B, Al, Ga, In, P, As, Sb, and Ti were described as examples of effective additives to be doped in silicon. However, other elements, such as Bi, N, Li, Fe, Cu, Au, Ge, Sn, etc. can be used as well.

Further, the embodiments above have described an example where the surface acoustic wave element is mounted to a circuit board. However, the invention is not limited to this configuration, and for example, it may be configured in such a manner that the surface acoustic wave element is mounted to the cavity of a package, and the top surface of the package is sealed hermetically with a lid.

Further, the surface acoustic wave element 10 may be mounted to the circuit board through face-down flip chip bonding, or alternatively, it may be mounted to the circuit board through face-up wire bonding.

Furthermore, it goes without saying that the invention can be adapted to configurations other than the embodiments above, including other types of surface acoustic wave filter, such as a transversal filter, and other types of surface acoustic wave apparatus, such as a resonator and a duplexer, provided that the IDT electrode is included therein.

EXAMPLE

An example where the surface acoustic wave apparatus of the invention is fabricated will now be described.

Figure 10:
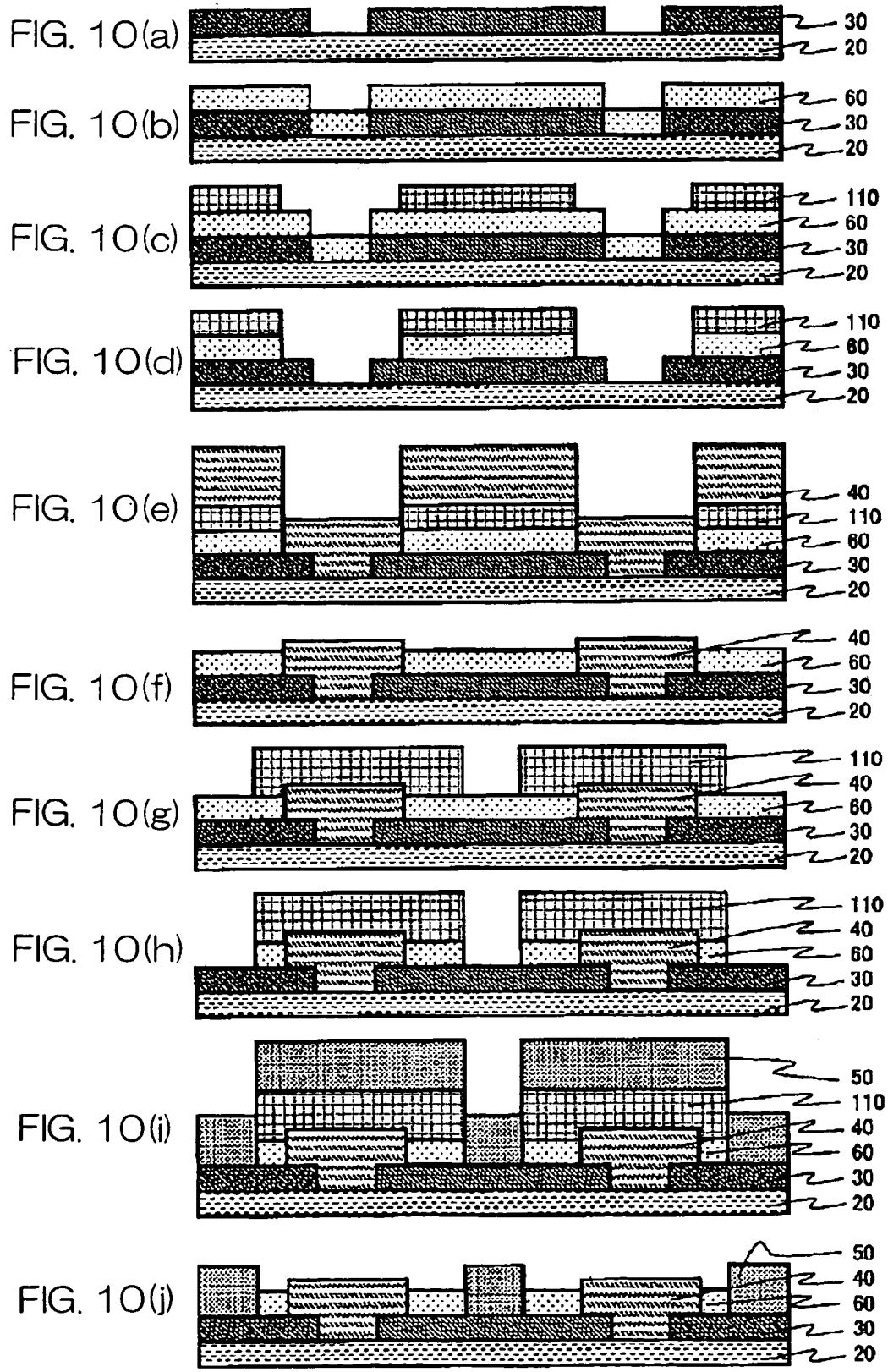
FIG. 10(a) through FIG. 10(j) are cross sections schematically showing the fabrication process of the surface acoustic wave element.

The fabrication process of the surface acoustic wave element will be described with reference to FIG. 10. A stepper (step and repeater) and an RIE (Reactive Ion Etching) apparatus are used for photolithography in this fabrication.

The piezoelectric substrate 20 (single crystal of lithium tantalate with Y-cut at 38.7°) is subjected to ultrasonic cleaning with the use of acetone, IPA, etc. to remove organic components. The substrate is then dried fully in a clean oven, after which the electrode film 30 is deposited on one main surface of the piezoelectric substrate 20. For the film deposition of the electrode film 30, a sputtering apparatus is used, and the electrode film 30 made of Al—Cu (1 wt % of Cu) is deposited. The thickness of this electrode film is approximately 2000 Å.

Also, an electrode film (not shown) is deposited on the other main surface of the piezoelectric substrate 20 in the same manner.

Resist 110 is spin coated to a thickness of approximately 0.6 μm.

The resist 110 is then patterned to a desired shape by the stepper, and the resist 110 on the unwanted portion is dissolved into an alkaline developer in a developing apparatus to form a desired resist pattern.

The RIE apparatus then performs etching to from the Al—Cu electrodes 30.

The resist 110 is then peeled off, and the patterning of the Al—Cu electrodes 30 is completed (see FIG. 10(a)).

As has been described above, the resistor made of an oxide semiconductor, such as CuO, $Cu_2O$, and $CuAlO_2$, can be formed on the piezoelectric substrate 20 during the patterning process of the electrode film 30. In this example, $LiTaO_3$ is used for the piezoelectric substrate 20; however, $LiNbO_3$ can be used as well. In this case, Li falls off from the surface of the piezoelectric substrate 20 to form $Nb_2O_3$ on the surface of the piezoelectric substrate 20, and the resulting $Nb_2O_3$ may serve as the resistor. When this resistor is formed, the electrodes 30 are electrically connected to each other directly via this resistor.

The passivation film 60 made of $SiO_2$ is deposited in a thickness of 200 Å by a CVD apparatus (see FIG. 10(b)).

In this example, $SiO_2$ is used as the passivation film 60; however, Si can be used as well. In this case, as has been described, Al in the electrodes 30 diffuses into the passivation film 60, and the passivation film 60 turns to an Al-added p-type Si, which lowers the resistivity of the passivation film 60. The passivation film 60 thus functions as the resistor that enables electrical conduction between the electrodes 30.

The resist 110 is applied again across the entire surface to a thickness of approximately 8 μm. Then, the resist 110 on the portion where the resistors 40 will be formed is cut through exposure (see FIG. 10(c)).

The $SiO_2$ passivation film 60 on the portion where the resistors 40 will be formed is removed by means of CDE (Chemical Dry Etching) (see FIG. 10(d)).

The silicon film 40, which will be made into the resistors 40 later, is formed in a thickness of 7500 Å. A sputtering apparatus is used for the film deposition, and B-doped silicon is used as the target. A quantity of doped B is determined in such a manner that the resistivity of the resistors 40 after film deposition is in a range from 1 to 100 Ω·m.

The resistors 40 are of a compact, reasonable shape. Also, by setting the thickness of the silicon film 40 to 7500 Å, which is sufficiently larger than 2000 Å, that is, the thickness of the respective electrodes 30, it is possible to ensure the electrical connection between the respective electrodes 30 and resistors 40 (see FIG. 10(e)).

The resist 110, together with the silicon film 40 on the resist, is removed by means of lift-off to form the resistors 40 (see FIG. 10(f)).

The resist 110 is applied once again across the entire surface to a thickness of approximately 8 μm, and the resist 110 on the portion over the input and output pad electrodes 35 and 36 and the grounding annular electrode 37, where the conductor film 50 will be formed, is cut through exposure (see FIG. 10(g)).

The $SiO_2$ passivation film 60 on the portion where the conductor 50 will be formed is removed by means of CDE (see FIG. 10(h)).

Films of Cr, Ni, and Au are sequentially deposited in this order in a thickness of 100 Å, 10000 Å, 2000 Å, respectively, by means of sputtering to form the conductor film 50 (see FIG. 10(i)).

The resist 110, together with the conductor film 50 on the resist, is removed by means of lift-off, whereupon the patterning of the conductor film 50 is completed (see FIG. 10(j)).

The wafer is then diced along the dicing lines, and divided to chips to complete the surface acoustic wave elements. The chip size is 1.1×1.3 mm.

The mounting to the circuit board 70 will now be described.

The completed surface acoustic wave element 10 is mounted to the circuit board 70 made of glass ceramics through face-down bonding (see FIG. 2). Initially, the solder bumps 90 are formed on the connection electrodes 80, which have been formed on the circuit board 70 at the portions corresponding to the input and output pad electrodes 35 and 36 and the grounding annular electrode 37, and the surface acoustic wave element 10 is mounted thereon through face-down bonding followed by heat compression bonding by applying ultrasonic waves, after which the bonded components are subjected to the reflow at 240° C. and sealed hermetically.

In this example, $SiO_2$ is used as the passivation film 60; however, Si can be used as well. In this case, as has been described above, Sb in the solder diffuses into the passivation film 60, and the passivation film 60 turns to Sb—added n—type Si, which lowers the resistivity. The passivation film 60 thus functions as the resistor between the electrodes 30.

Subsequently, epoxy-based resin is printed by a vacuum printer, and subjected to curing under the conditions: at 100° C. for one hour and at 150° C. for three hours. Finally, the substrate is diced to the shape of each apparatus to form a divided apparatus, whereupon the surface acoustic wave apparatus is completed.

A heat cycle test was applied to the surface acoustic wave apparatus obtained in the above manner, and the effect for a discharge breakdown in the IDT electrode 30a was validated. According to the test method, the low temperature side was −40° C. and the high temperature side was +85° C., the keep time was 30 minutes and the transition time was two minutes in one cycle, and ten cycles were repeated herein.

Samples were made by varying the resistance value between the oppositely paired comb-teeth-shaped electrodes by changing the shape, the number, and the connection method of the resistors 40, and the discharge breakdown preventing effect was validated by the heat cycle test under the conditions specified above. Then, it is understood that a discharge breakdown can be prevented in a reliable manner by setting the resistance value between the oppositely paired comb-teeth-shaped electrodes to 30 MΩ or below.

Figure 11:
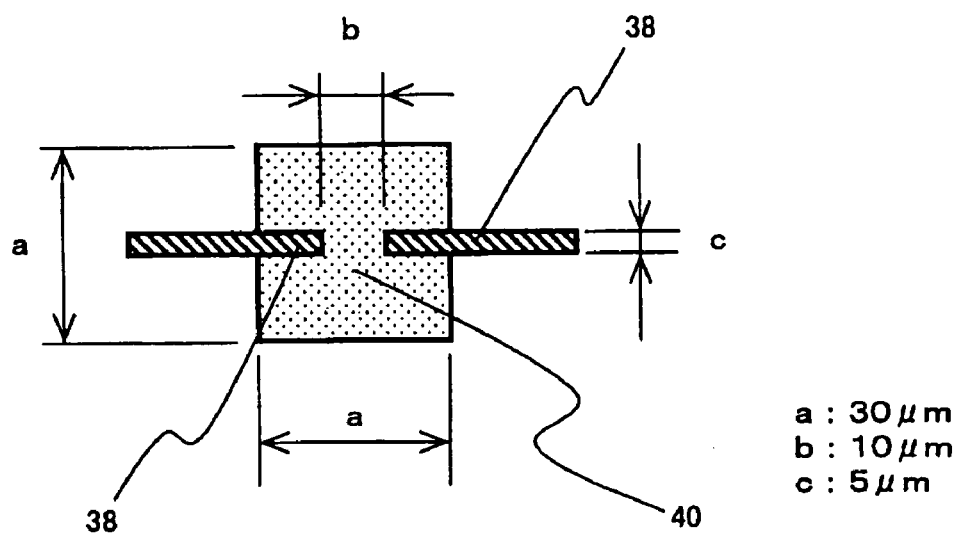
FIG. 11 is a plan view schematically showing the structure of a resistor formed in an example.
Figure 12:
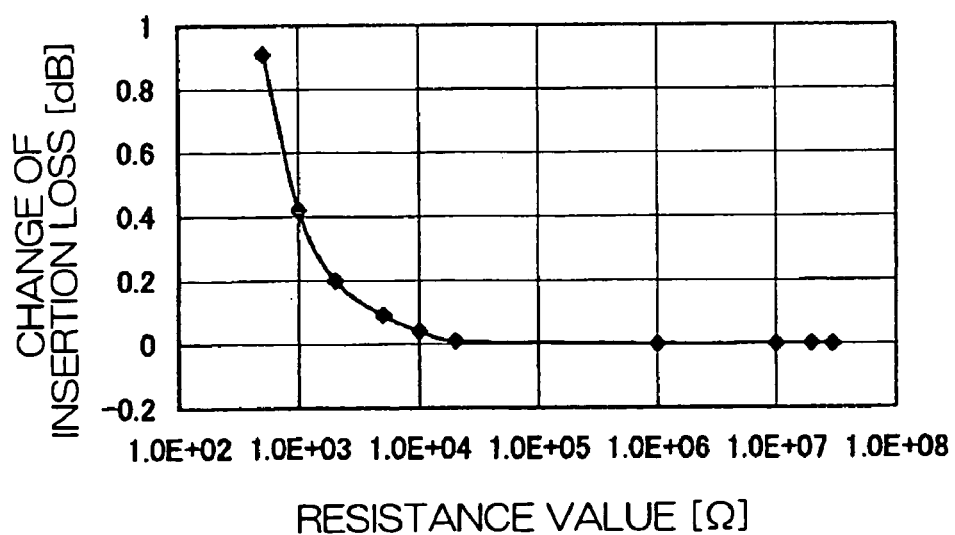
FIG. 12 is a characteristic view showing the relation of the resistance value between an electrode to be at a signal potential and an electrode to be at a ground potential and an insertion loss of the surface acoustic wave element.

Incidentally, by shaping the resistor as is shown in FIG. 11, the resistance value of approximately 37 MΩ was obtained in a single resistor, and it was possible to obtain a resistor of a reasonable shape having an adequate resistance value.

A change of the electric characteristic (insertion loss) of the surface acoustic wave apparatus (filter) was checked by varying the resistance value between the electrode at the signal potential and the electrode at the ground potential by changing the shape, the number, and the connection method of the resistors 40, the result of which is set forth in Table 1 below and in FIG. 8.

TABLE 1

| Resistance Value [Ω] | Insertion Loss [dB] | Change in Insertion Loss [dB] |
|---|---|---|
| 30 M | 0.85 | 0 |
| 20 M | 0.85 | 0 |
| 10 M | 0.85 | 0 |
| 1 M | 0.85 | 0 |
| 20 k | 0.86 | 0.01 |
| 10 k | 0.89 | 0.04 |
| 5 k | 0.94 | 0.09 |
| 2 k | 1.05 | 0.20 |
| 1 k | 1.27 | 0.42 |
| 500 | 1.76 | 0.91 |

As is obvious from Table 1 above and FIG. 8, it is understood that, by setting the resistance value between the electrode at the signal potential and the electrode at the ground potential to 20 kΩ or above, the electric characteristic of the surface acoustic wave apparatus remained the same (there is an insertion loss of 0.01 dB at 20 kΩ; however, this is within an allowance of measurement error and it is assumed that there was no substantial change). Also, it turned out that deterioration of the insertion loss can be suppressed to 0.2 dB less by setting the resistance value between the electrode at the signal potential and the electrode at the ground potential to 2 kΩ or above. It is general for a handset maker that uses the surface acoustic wave apparatus to judge the presence of an apparent difference in characteristic when there is a difference of 0.2 dB in insertion loss. Hence, by setting the resistance value between the electrode at the signal potential and the electrode at the ground potential to 2 kΩ or above, it is possible to suppress a change of the electric characteristic of the surface acoustic wave apparatus within an allowable level.

In this example, silicon was used as the semiconductor material. However, besides silicon, other semiconductor materials can be used as well. Also, B was used as an additive to be doped in silicon; however, other elements can be used as well.

Also, the circuit board 70 comprises a glass ceramics substrate. However, other ceramics substrates, such as alumina, or a resin substrate, such as a glass epoxy substrate, can be used as well. In addition, the electrodes made of Al—Cu alloy were used as the electrodes; however, it goes without saying that other materials, such as Ni and Ti, can be used as well. Furthermore, besides silicon dioxide or silicon insulating materials, such as silicon nitride, may be used as the passivation film 60. Moreover, epoxy resin was printed by the vacuum printer; however, printing may be performed at an atmospheric pressure, followed by vacuum degassing.

What is claimed is:

1. A surface acoustic wave apparatus formed by mounting a surface acoustic wave element to a circuit board, wherein:
    said surface acoustic wave element includes a piezoelectric substrate, an electrode, formed on one main surface of said piezoelectric substrate, to be at a ground potential, and an IDT electrode formed on said one main surface of said piezoelectric substrate;
    said IDT electrode is an electrode comprising paired comb-teeth-shaped electrodes, each having plural electrode fingers, oppositely placed in such a manner that the electrode fingers of one comb-teeth-shaped electrode are positioned between the electrode fingers of the other comb-teeth-shaped electrode;
    either of said comb-teeth-shaped electrodes forming said IDT electrode is connected to said electrode to be at the ground potential via a resistor formed entirely on said one main surface of said piezoelectric substrate; and
    said resistor is made of a semiconductor.

2. The surface acoustic wave apparatus according to claim 1, wherein:
    said semiconductor is a 14 group semiconductor.

3. The surface acoustic wave apparatus according to claim 2, wherein:
    said 14 group semiconductor is silicon.

4. The surface acoustic wave apparatus according to claim 3, wherein:
    said silicon includes at least one element selected from B, Al, Ga, In, P, As, and Sb as a dopant.

5. The surface acoustic wave apparatus according to claim 1, wherein:
said semiconductor is a 12–16 group semiconductor.

6. The surface acoustic wave apparatus according to claim 1, wherein:
said semiconductor is an oxide semiconductor.

7. The surface acoustic wave apparatus according to claim 1, wherein:
a resistance value between the comb-teeth-shaped electrode to be at a signal potential in said IDT electrode and said electrode to be at the ground potential is between 2 kΩ and 30 MΩ both inclusive.

8. The surface acoustic wave apparatus according to claim 1, wherein:
a resistance value between the comb-teeth-shaped electrode to be at a signal potential in said IDT electrode and said electrode to be at the ground potential is between 20 kΩ and 30 MΩ both inclusive.

9. A communications device, comprising:
a switching circuit or a duplexer circuit, connected to an antenna terminal, to switch transmission to reception and vice versa;
a power amplifier circuit, connected to said switching circuit or said duplexer circuit, to amplify a transmission signal; and
a filter, inserted in a signal path from said power amplifier circuit to said antenna terminal, to attenuate an unwanted wave component in the transmission signal, wherein said filter is formed by using the surface acoustic wave apparatus according to claim 1.

10. A surface acoustic wave apparatus formed by mounting a surface acoustic wave element to a circuit board, wherein:
said surface acoustic wave element includes a piezoelectric substrate and an IDT electrode formed on one main surface of said piezoelectric substrate;
said IDT electrode is an electrode comprising paired comb-teeth-shaped electrodes, each having plural electrode fingers, oppositely placed in such a manner that the electrode fingers of one comb-teeth-shaped electrode are positioned between the electrode fingers of the other comb-teeth-shaped electrode;
said paired comb-teeth-shaped electrodes forming said IDT electrode are connected to each other via a resistor formed entirely on said one main surface of said piezoelectric substrate; and
said resistor is made of a semiconductor.

11. The surface acoustic wave apparatus according to claim 10, wherein:
said semiconductor is a 14 group semiconductor.

12. The surface acoustic wave apparatus according to claim 11, wherein:
said 14 group semiconductor is silicon.

13. The surface acoustic wave apparatus according to claim 12, wherein:
said silicon includes, as a dopant, at least one element selected from B, Sb, Ti, and Al.

14. The surface acoustic wave apparatus according to claim 10, wherein:
said semiconductor is a 12–16 group semiconductor.

15. The surface acoustic wave apparatus according to claim 10, wherein:
said semiconductor is an oxide semiconductor.

16. The surface acoustic wave apparatus according to claim 15, wherein:
said oxide semiconductor is at least one kind selected from $TiO_2$, CuO, $Cu_2O$, $CuAlO_2$, NiO, and $Nb_2O_3$.

17. The surface acoustic wave apparatus according to claim 16, wherein:
said $TiO_2$ includes at least one element selected from Sb, F, Cl, N, Cr, Pd, Ta, Ni, and Cu as a dopant.

18. The surface acoustic wave apparatus according to claim 10, wherein:
a resistance value between said paired comb-teeth-shaped electrodes forming said IDT electrode is between 20 kΩ and 30 MΩ both inclusive.

19. A communications device, comprising:
a switching circuit or a duplexer circuit, connected to an antenna terminal, to switch transmission to reception and vice versa;
a power amplifier circuit, connected to said switching circuit or said duplexer circuit, to amplify a transmission signal; and
a filter, inserted in a signal path from said power amplifier circuit to said antenna terminal, to attenuate an unwanted wave component in the transmission signal, wherein said filter is formed by using the surface acoustic wave apparatus according to claim 10.

20. The surface acoustic wave apparatus according to claim 1, wherein:
the electrode, formed on the one main surface of said piezoelectric substrate, to be at a ground potential is an annular electrode surrrounding the IDT electrode and the resistor is formed inside of the annular electrode.

21. The surface acoustic wave apparatus according to claim 10, wherein:
the resistor formed on said one main surface of said piezoelectric substrate is a passivation film formed on the paired comb-teeth-shaped electrodes forming the IDT electrode.

* * * * *